United States Patent [19]
Bonora et al.

[11] Patent Number: 5,895,191
[45] Date of Patent: Apr. 20, 1999

[54] SEALABLE, TRANSPORTABLE CONTAINER ADAPTED FOR HORIZONTAL LOADING AND UNLOADING

[75] Inventors: Anthony C. Bonora, Menlo Park; William J. Fosnight, Newark, both of Calif.

[73] Assignee: Asyst Technologies, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/518,517

[22] Filed: Aug. 23, 1995

[51] Int. Cl.⁶ .................................................. B65G 49/07
[52] U.S. Cl. .......................... 414/217; 414/940; 206/711
[58] Field of Search .......................... 414/217, 292, 414/411, 416, 940; 220/262, 477, 480, 796, 801–804, 806; 206/710, 711

[56] References Cited

U.S. PATENT DOCUMENTS

| | | | |
|---|---|---|---|
| 4,684,021 | 8/1987 | Niebling et al. | 414/940 X |
| 4,776,462 | 10/1988 | Kosugi et al. | 206/710 X |
| 4,842,136 | 6/1989 | Nakazato et al. | 220/339 X |
| 5,224,809 | 7/1993 | Maydan et al. | 414/217 |
| 5,255,783 | 10/1993 | Goodman et al. | 206/711 |
| 5,291,923 | 3/1994 | Gallagher et al. | 414/292 X |
| 5,464,475 | 11/1995 | Sikes et al. | 414/940 X |
| 5,482,161 | 1/1996 | Williams et al. | 206/711 |
| 5,628,683 | 5/1997 | Gentischer | 414/217 X |
| 5,713,711 | 2/1998 | McKenna et al. | 414/940 X |

FOREIGN PATENT DOCUMENTS

WO 92/02950   2/1920   Germany.

OTHER PUBLICATIONS

Modular Isolation Capsule Is Here, Product Brochure.

*Primary Examiner*—James W. Keenan
*Attorney, Agent, or Firm*—Fliesler, Dubb, Meyer & Lovejoy

[57] ABSTRACT

A transportable container for storing and carrying articles such as semiconductor wafers or flat panel display substrates which is adapted for horizontal loading and unloading. The container includes a box and a box door. The box door can be sealably attached to the box to isolate the interior of the box from ambient atmospheric conditions. The container is adapted to mate with a port of a canopy which encloses a semiconductor processing apparatus.

36 Claims, 14 Drawing Sheets

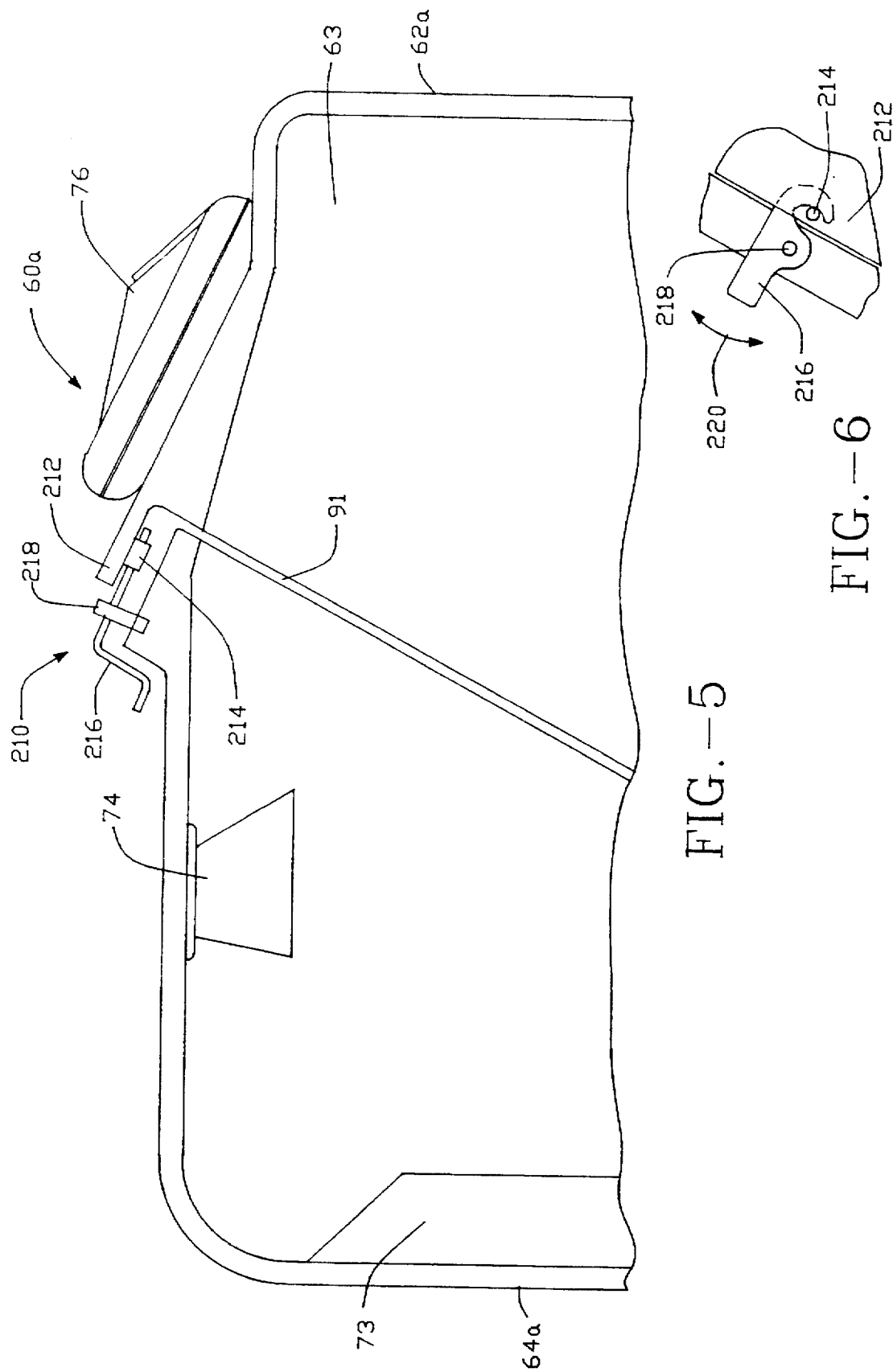

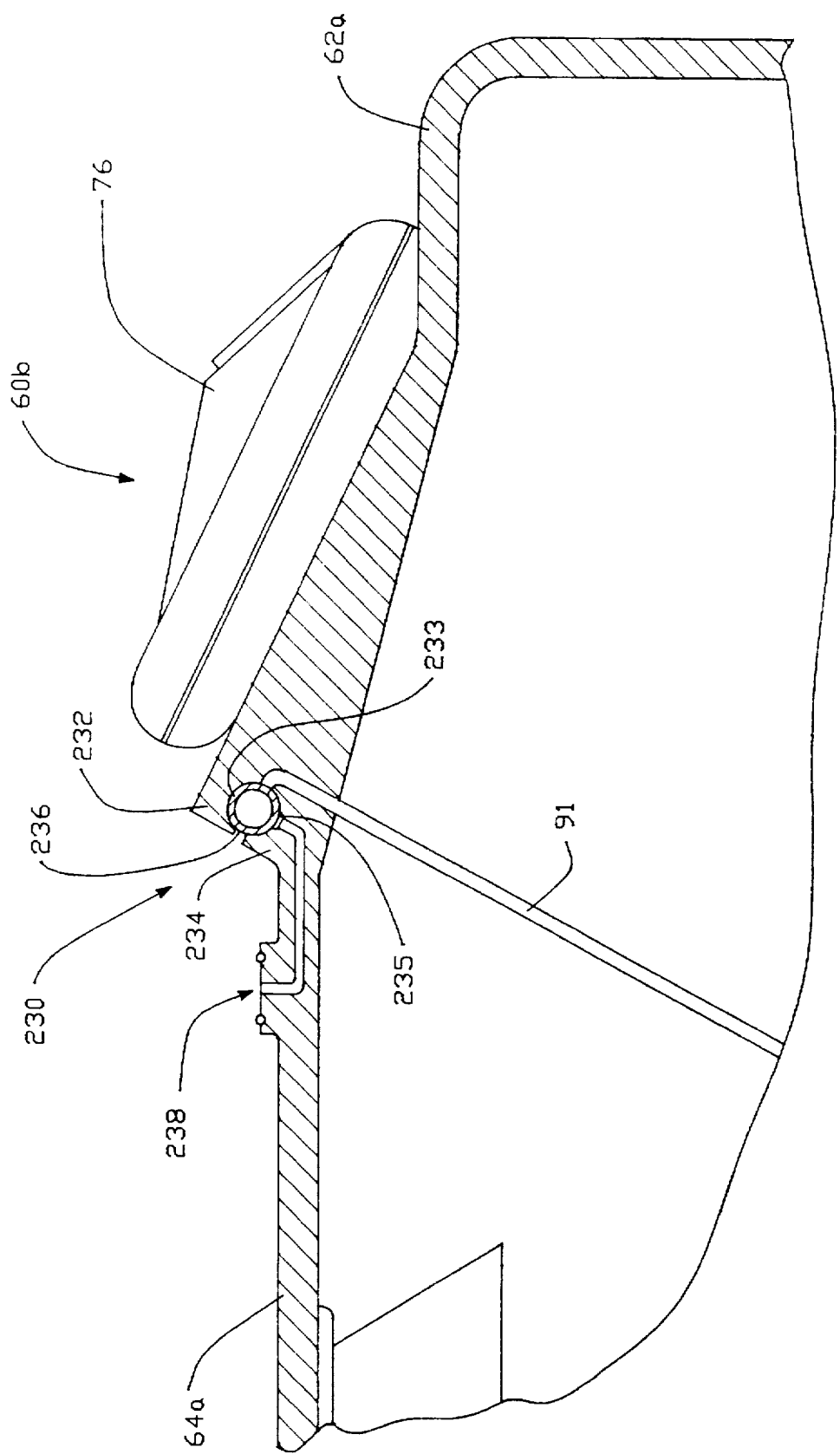

SEALABLE, TRANSPORTABLE CONTAINER ADAPTED FOR HORIZONTAL LOADING AND UNLOADING

BACKGROUND OF THE INVENTION

1. Field of the Invention

The present invention relates to standardized mechanical interface systems for reducing particle contamination of semiconductor wafers during semiconductor processing. More particularly, the present invention relates to a sealable, transportable container that has been adapted for horizontal loading and unloading.

2. Description of the Related Art

A standardized mechanical interface (SMIF) system has been proposed by the Hewlett-Packard Company as disclosed in U.S. Pat. No. 4,532,970 and 4,534,389. The purpose of the SMIF system is to reduce particle fluxes onto articles, for example, semiconductor wafers. This end is accomplished, in part, by mechanically ensuring that during transportation and storage the gaseous media (such as air or nitrogen) surrounding the wafers is essentially stationary relative to the wafers and by ensuring that particles from the ambient environment do not enter the immediate wafer environment.

The SMIF concept is based on the realization that a small volume of controlled (with respect to motion, air flow direction and external contaminants), particle-free air provides a clean environment for wafers. Further details of one proposed system are described in the article entitled "SMIF: A TECHNOLOGY FOR WAFER CASSETTE TRANSFER IN VLSI MANUFACTURING," by Mihir Parikh and Ulrich Kaempf, *Solid State Technology*, Jul. 1984, pp. 111–115. SMIF systems are concerned with particle sizes which range from below 0.02 μm to above 200 μm. Particles with these sizes can be very damaging in semiconductor processing because of the small geometries employed in fabricating semiconductor devices. Typical advanced semiconductor processes today employ geometries which are one half micron and under. Unwanted contamination particles which have geometries measuring greater than 0.1 μm substantially interfere with 1 μm geometry semiconductor devices. The trend, of course, is to have smaller and smaller semiconductor processing geometries which today in research and development labs approach 0.2 μm and below. In the future, geometries will become smaller and smaller and hence smaller and smaller contamination particles become of interest.

A SMIF system has three main components: (1) minimum volume, sealed pods used for storing and transporting wafer cassettes; (2) canopies placed over cassette ports and wafer processing areas of processing equipment so that the environments inside the pods and canopies (after having clean air sources) become miniature clean spaces; and (3) a transfer mechanism to load/unload wafer cassettes from a sealed pod without contamination of the wafers in the wafer cassette from external environments.

One example of a conventional SMIF system is shown in FIGS. 1A and 1B, which illustrate a processing station 8 having a canopy 10 which is an easily removable shield that covers the wafer handling mechanism of processing equipment 12. Equipment 12 may be, for example, a photoresist applicator, mask aligner, inspection station or any similar processing equipment. The canopy 10, which is constructed of transparent plastic such as acrylic or polycarbonate to facilitate visual inspection and/or maintenance within the canopy 10, encloses the handling mechanism for the processing equipment 12 and a holder 14, such as a wafer cassette holding wafers 16. The environment within the processing equipment is separately maintained and separately cleaned; therefore, the equipment 12 need not be installed in a clean room.

A sealable transportable container (or pod) 18 including a box 20 having interior region 21 and a box door 32 is mounted on the horizontal surface 22 of a canopy 10 having a port assembly. The port assembly includes a port plate 24, port door 28, and an elevator assembly 30. Elevator assembly 30 transports a cassette 14, containing integrated circuit wafers 16 from the interior region 21 of a box 20 onto the region beneath the canopy 10.

In FIG. 1B, port door 28 and box door 32 are shown in the closed position by the dotted lines. A mover assembly 34 includes a platform 36, a shaft engagement device 38, and a drive motor 40. Platform 36, extending from elevator assembly 30, carries port door 28, box door 32 and cassette 14 in a vertical direction. Platform 36 is attached by engagement devices 38 to vertical guide 42 of elevator assembly 30.

Typically, guide 42 includes a lead screw (not shown) and the drive motor 40 drives a gear (not shown) which engages the lead screw for driving platform 36 up or down. When platform 36 is driven to the closed position, port door 28 closes the port opening in canopy 10. In a similar manner, a manipulator assembly shown generally by the numeral 44 is fastened to platform 46 which has an engagement means 48 for engaging vertical guide 42. Manipulator assembly 44 includes a manipulator arm 50 and engagement head 52 adapted to engage cassette 14. By vertical operation of the platforms 36 and 46 and by operation of the manipulator assembly 44, cassette 14 is moved from its position on box door 32 to a position on the equipment station 13 (as shown by the broken lines).

Although the SMIF system of FIGS. 1A and 1B has been successful in satisfying the need for a clean environment, areas of improvement have been identified for making the above-described system more convenient and efficient. For example, as can be seen in FIGS. 1A and 1B, a container is placed on top of the port. Typically, a port could be from 4 to 6 feet high. If the operator transporting the container is shorter than 6 feet, the operator may have trouble reaching the top of the port in order to position the container. Second, in order to remove a wafer from the container, the cassette must be lowered out of the container, the cassette must be moved to a work area and the wafer then removed from the cassette. Lowering and moving the cassette adds extra time to the semiconductor fabrication process and increases the risk of harm to the wafer due to the extra movement. It would be advantageous if the cassette can be easily and quickly removed from the container or if the wafer can be removed from the container without removing the cassette from the container. Third, in some applications a gas, such as nitrogen, is injected into the container. A cassette in the conventional container could partially block gas from entering at the bottom of the container. Finally, there is a need to have a retainer that holds the wafer and cassette stationary that is easy to manufacture and convenient to use.

SUMMARY OF THE INVENTION

The present invention is directed to overcome the disadvantages of the prior art. Thus, the present invention provides for a sealable, transportable container adapted to allow for horizontal loading and unloading. The container includes a box, with an opening, for storing articles. The opening can be closed by a box door. The plane at which the box and box door meet forms a bias (or diagonal line) on a profile of the container. This arrangement provides for the easy removal and insertion of articles (e.g. a cassette or wafer) into and out of the container.

One embodiment of the invention provides for a sealable, transportable container for storing articles. The container is used with processing equipment having a port, the port having a port sealing surface. The container comprises a box and a box door. The box has a bottom surface generally defining a first plane, an opening, a first sealing surface surrounding the opening, a second sealing surface surrounding or outside the first sealing surface. The second sealing surface is adapted to form a seal with the port sealing surface. The first sealing surface is in a second plane that intersects the first plane at an angle greater than zero degrees and less than 90 degrees. The box door has a third sealing surface that forms a seal with the first sealing surface of the box when the box door is moved to a sealing position with respect to the box. The container also includes a latch mechanism for holding the box door in the sealing position.

These and other objects and advantages of the invention will appear more clearly from the following description in which the preferred embodiment of the invention has been set forth in conjunction with the drawings.

BRIEF DESCRIPTION OF THE DRAWINGS

FIG. 5 shows the top of a container with an alternative mechanical latch for securing the box door to the box.

FIG. 6 shows a bird's eye view of the latch of FIG. 5.

FIG. 7 shows the top of a container.

DESCRIPTION OF THE PREFERRED EMBODIMENT

The present invention will be described in the context of a system for storing and transporting wafers, reticles or flat panel display substrates. However, it is to be understood that a sealable, transportable container in accordance with the present invention may be used to store and transport many other inanimate objects (for example hard disks for computers or laser discs) as well as living objects such as laboratory animals.

Figure 1A:
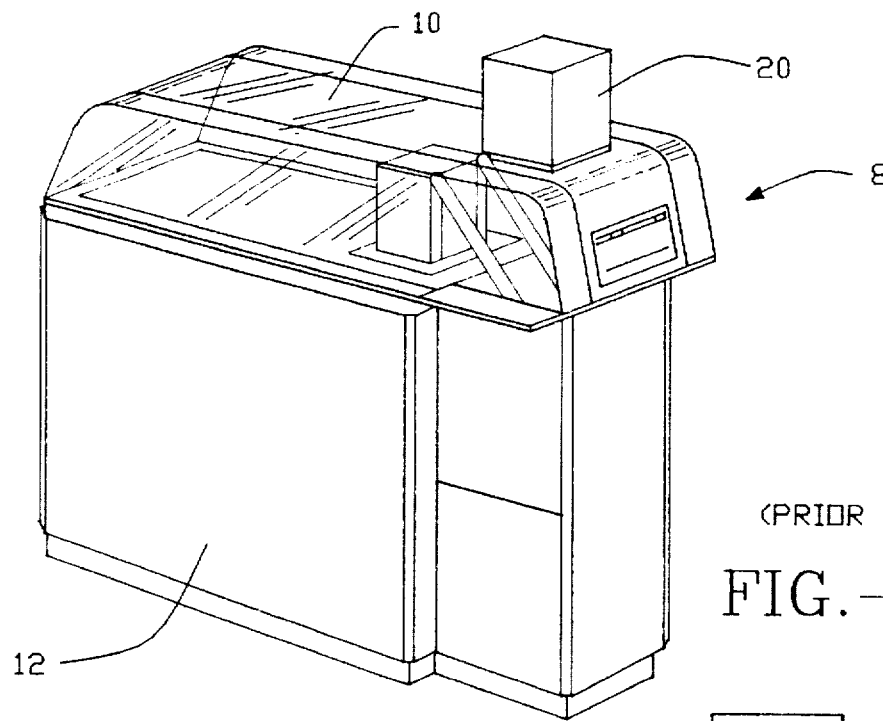
FIG. 1A is an isometric view of a processing station having a canopy for receiving a conventional SMIF pod.
Figure 1B:
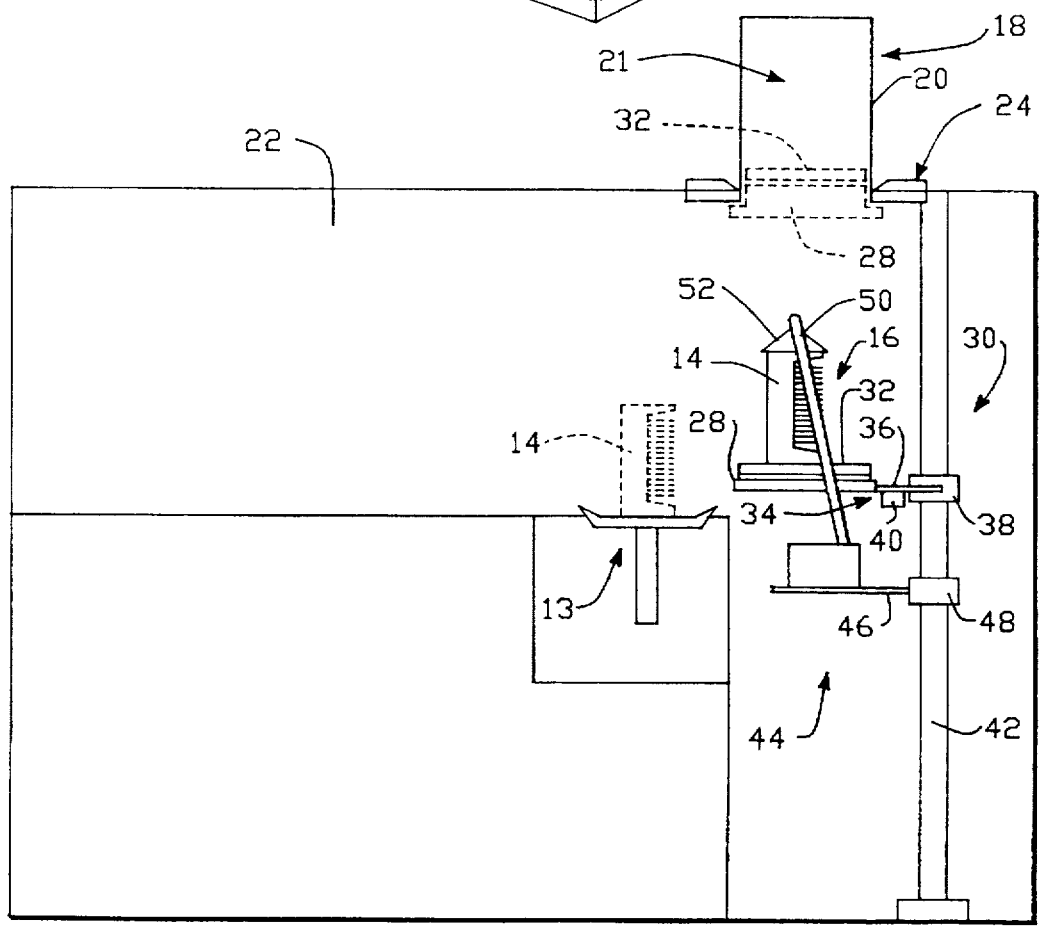
FIG. 1B is a cutaway side view of the processing station of FIG. 1A.
Figure 2:
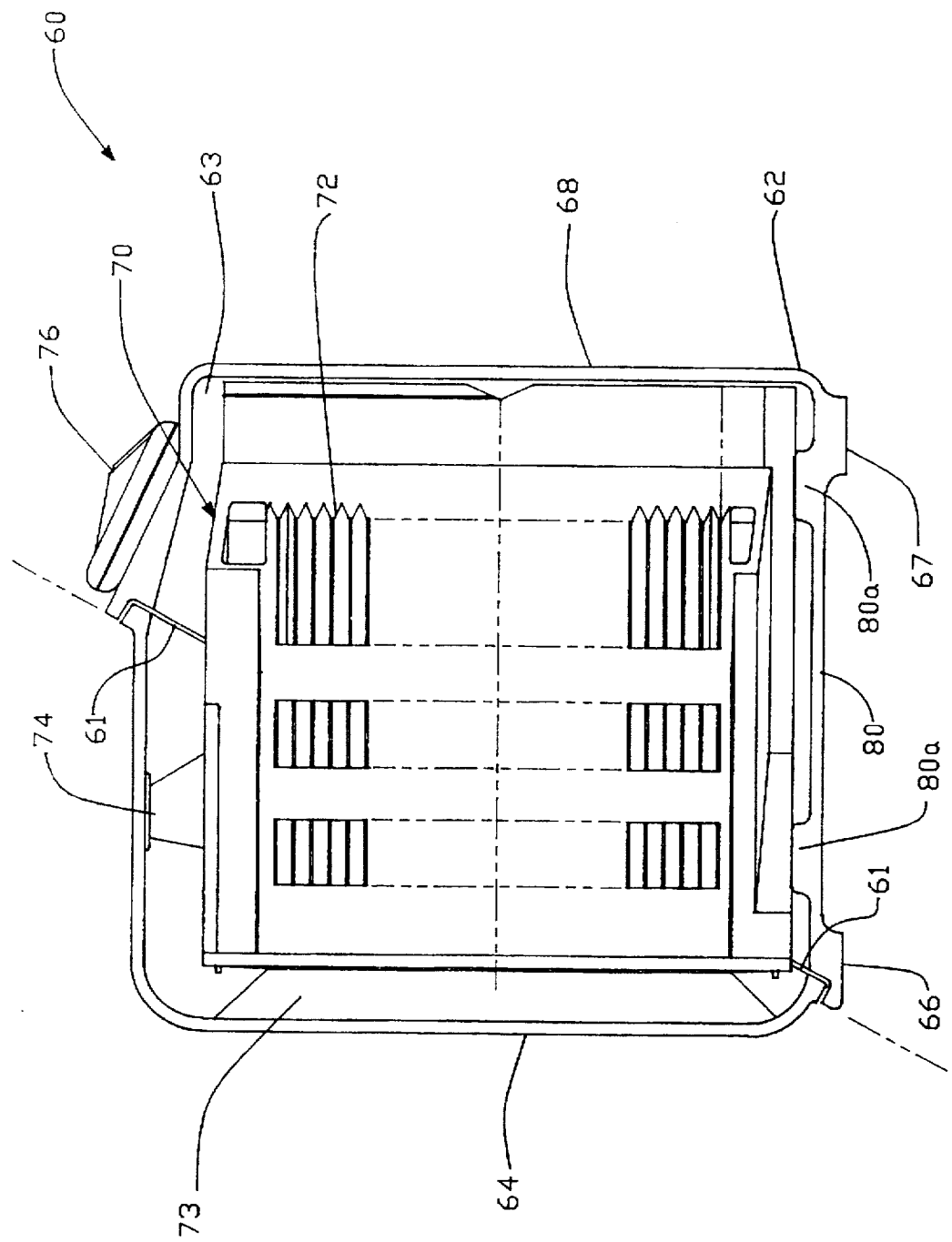
FIG. 2 is a cutaway side view of the preferred embodiment container of the present invention.

FIG. 2 shows the preferred embodiment of the present invention. A container is shown generally by reference numeral 60. The container 60 depicted in the drawings generally has a rectangular shape; however, a round or other shaped container is also within the spirit of the present invention. Container 60 is made up of a base 62 and a cover 64. Base 62 and cover 64 can also be referred to as a box and box door, respectively, because cover (box door) 64 can be lifted, thus opening container 60 while the object stored in container 60 remains on or within the base (box) 62. Box 62 has an opening corresponding to the perimeter 61 of box 62 which mates with box door 64. Box 62 has an interior region 63 where articles are stored and a bottom surface for supporting the articles. In the preferred embodiment, the articles are wafers 72 which are stored in a cassette 70. The cassette 70 fits inside the interior region 63 and sits on bottom surface 80. The box has a shell 68 made of polyether ether keytone (PEEK), or polycarbonate with carbon fibers or graphite fibers, or a metal such as stainless steel or deep drawn aluminum. In the preferred embodiment, shell 68 is not conductive but alternative embodiments could include a static dissipative shell.

Attached to box door 64 is a wafer retainer 73, which holds wafers 72 substantially in place while container 60 is being transported. Furthermore, wafer retainer 73 can be static dissipative and, thus, act as a path to ground. Also attached to door 64 is cassette retainer 74, which prevents motion of cassette 70 with respect to container 60. Because cassette retainer 74 and wafer retainer 73 are attached directly to door 64, one motion of closing door 64 also engages cassette 70 and wafers 72. Box 62 also has two feet 66 and 67 for supporting the container.

Attached to the top of container 60 is a tag 76 which may include a processor and a memory used to store the identity, status and history of articles in container 60. Tag 76 is further disclosed in U.S. Pat. No. 5,097,421, Intelligent Wafer Carrier; U.S. Pat. No. 4,974,166, Processing Systems with Intelligent Article Tracking; and U.S. Pat. No. 5,166,884, Intelligent System for Processing and Storing Articles, all three of which are incorporated by reference.

Figure 3:
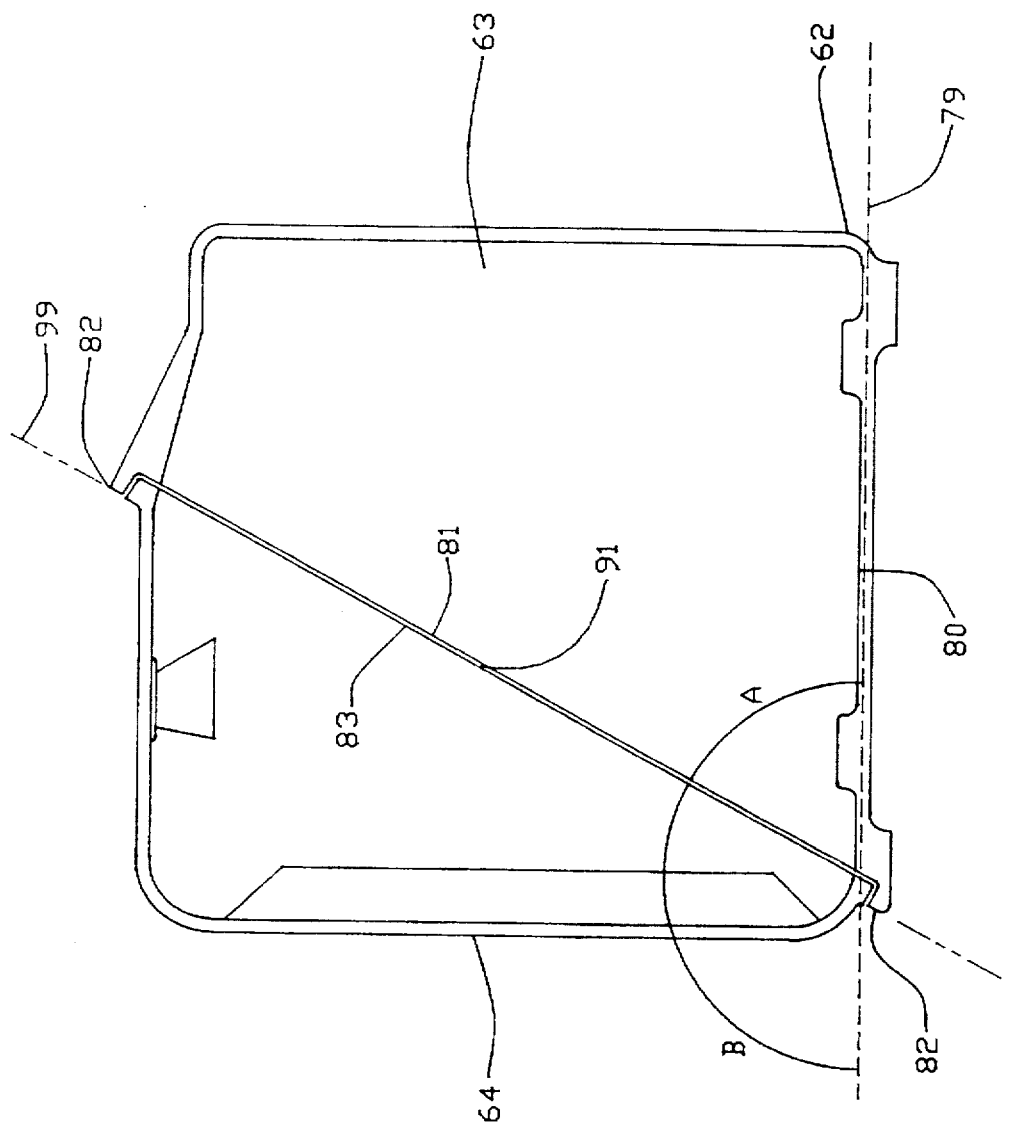
FIG. 3 is a side view of the container of FIG. 2 showing the shell and the port plane.

Box 62 and box door 64 are designed to mate with each other thereby forming a seal so that interior region 63 is isolated from ambient atmospheric conditions. Additionally, box 62 is also designed to mate with a port of a processing station. With reference to FIG. 3, box 62 has a first sealing surface 81 which surrounds the opening in box 62. Box 62 has a second sealing surface 82 which surrounds first sealing surface 81 and is adapted to mate with the port (discussed below). Box door 64 has a peripheral edge having a third sealing surface 83. When box door 64 is moved into a sealing position (or mating position) with respect to box 62 (as shown in FIGS. 2–3) sealing surfaces 81 and 83 form a first seal 91 isolating interior region 63 from ambient atmospheric conditions. First seal 91 could be formed with O-rings, flexible lips, inflatable tubes, a gasket, rubber cross fittings, mating two plastic members or other seals known in the art.

The angle of the opening in box 62 as compared to bottom surface 80 allows for the cassette to be easily removed from and inserted into the container. The opening in box 62 is generally along first sealing surface 81. The opening in box 62 or first sealing surface 81 generally defines (or lies in) a first plane. Bottom surface 80 generally defines (or lies in) a second plane. The two planes intersect at an angle greater than 0 degrees and less than 90 degrees. Referring to FIG. 3, the angle of intersection can be measured at angle A or angle B. As long as one of the angles is greater than 0 degrees and less than ninety degrees, the two planes are said to intersect at an angle greater than 0 degrees and less than ninety degrees. The point is that the two planes cannot be perpendicular or parallel. The angle of intersection is defined as the bias angle. That is because looking at FIG. 3, it can be seen that seal 91 forms a bias (or diagonal line) across the profile of the container.

Bottom surface 80, the opening and sealing surface 81 are described to "generally define" a plane. The word "generally" is used to allow for a surface, opening or seal that does not have an entirely flat profile. For example, bottom surface 80 has two tabs 80a. Thus, bottom surface 80 is not flat but it can be interpolated to generally define a plane along its length, shown by dotted line 79. The opening and the first sealing surface 81 are shown with straight lines in the drawings. It is within the spirit of the present invention to allow for an opening and a first sealing surface that does not have a straight edge or straight profile. In such a case, one can interpolate to define a plane running generally along the length or diameter of the opening or sealing surface. Thus, the term "generally" is used.

Figure 4:
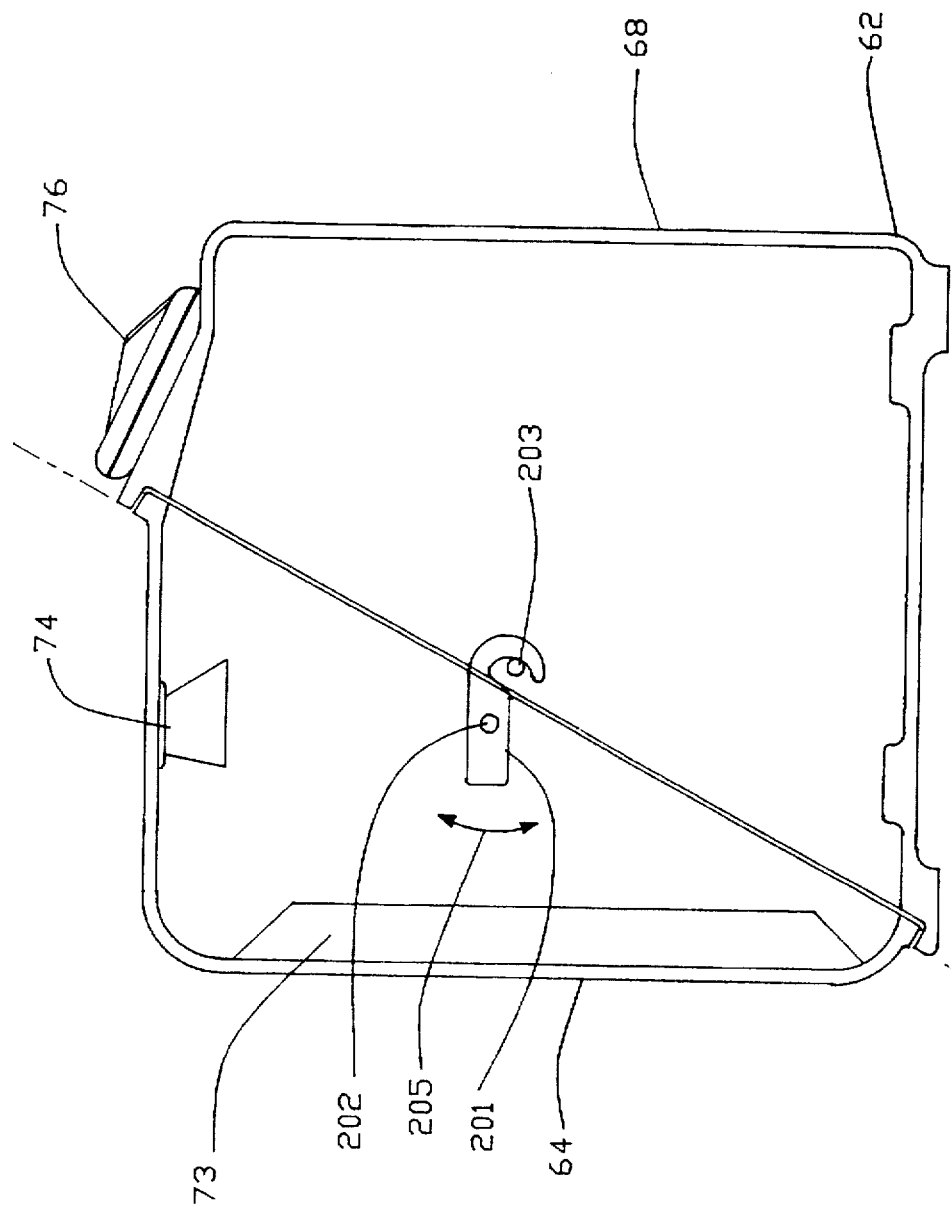
FIG. 4 shows a container with a mechanical latch for securing the box door to the box.

FIG. 4 shows container 60 with a mechanical door latch for holding box door 64 in a sealing position with respect to box 62. A latch is defined as any mechanism that holds box door 64 in a sealing or mating position with respect to box 62. Mounted on box 62 is a pin 203. Box door 64 has a hook 201 that is attached to a pivot 202. Hook 202 rotates in the direction of arrow 205, and can be rotated such that the tip of hook 201 grabs pin 203 pulling box door 64 toward box 62. In the preferred embodiment, container 60 would have two mechanical door latches. The latch shown in FIG. 4 could be activated by the port.

FIG. 5 shows the top of container 60a with an alternative embodiment for the mechanical door latch of FIG. 4, shown generally as 210. Underneath upper lip 212 is a pin 214. Box door 64a has a pivot 218 attached to a hook 216. Hook 216 can rotate about pivot 218 grabbing pin 214 and pulling box door 64 toward box 62, similar to the latch in FIG. 4. FIG. 6 is a bird's eye view of latch 210 showing how hook 218 rotates in the direction of arrow 220. For best results, container 60 should have two latches. It is also contemplated that the latch of FIG. 5 can be on the same container as the latch shown in FIG. 4. Additionally, latch 210 could be activated by an apparatus on the port.

FIG. 7 depicts the top of container 60b with a combination box door seal and retainer, shown generally as 230. Box 62a has an upper lip 232 with a semi-circular indentation 233. Box door 64a has a lower lip 234 also with a semicircular indentation 235. Fitting within both semicircular indentations 233 and 235 is a vacuum deflatable seal 236. When seal 236 is in a relaxed state its cross section is circular, thereby exerting a force against lip 232 and lip 235 preventing box 64a door from being removed from box 62a and providing a seal between box 62a and box door 64a. To remove box door 64a from box 62a one would apply a vacuum to vacuum application port 238. Vacuum application port 238 communicates the vacuum to the vacuum deflatable seal 236, which causes vacuum deflatable seal 236 to become flat allowing box door 64 to be removed from box 62. In one alternative, vacuum application port 238 can be located on the box rather than the box door. In another alternative, seal 236 would only be along the top perimeter of box 62a-box door 64a interface. In another alternative, the deflatable seal could run along the entire box 62-box door 64a interface thereby being a complete loop and providing the seal 91.

Box 62 could also be designed to include handles on the side or the top of box 62 for holding container 60. Box door 64 could be transparent so that clean room workers can see inside container 60.

Figure 8:
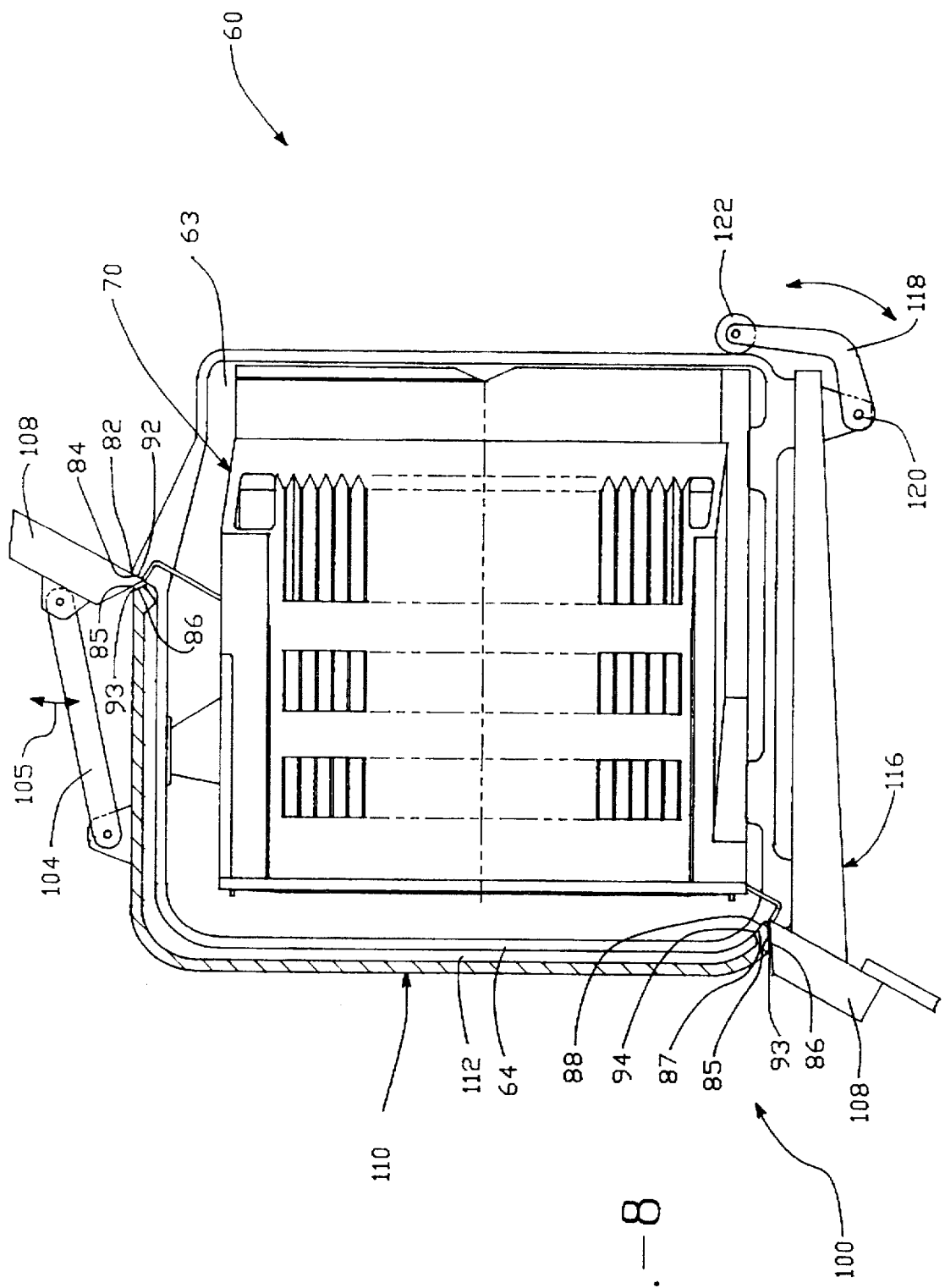
FIG. 8 depicts the container of the present invention engaging a port.

FIG. 8 shows container 60 engaging a horizontal loading port 100. Port 100 includes a port plate 108 and a port door 110. Port 100 is adapted to receive container 60 and allow wafers 72 to be transferred from container 60 to the processing equipment while remaining in a clean environment.

Box 62 has a second sealing surface 82 which mates with a fourth sealing surface 84 on port plate 108 forming a second seal 92 when the container is moved into a sealing position with respect to the port (as shown in FIG. 8). In the preferred embodiment, second seal 92 can provide an airtight seal so that when box door 64 and port door 110 are removed, interior region 63 of container 60 and the canopy of the semiconductor manufacturing apparatus form a mini-environment (shown in FIGS. 10–14) isolated from ambient atmospheric conditions. Second seal 92 can be formed by any of the same materials described above with respect to the first seal, or any other type of seal known in the art.

When container 60 is moved into a sealing position with respect to port 100, box 62 rests on a support shelf 116 and is held in the sealing position by a retaining lock 118. The container retaining lock 118 has a hinge 120 and a rotating wheel 122, so that when container 60 is lowered onto shelf 116, wheel 122 rides up against box 62 causing lock 118 to pivot about hinge 120. Thus, lock 118 exerts a force on container 60, retaining container 60 on port support shelf 116.

Port door 110 has a fifth sealing surface 85. Port plate 108 has a sixth sealing surface 86. When port door 110 is moved into a sealing position with respect to port plate 108 (as shown in FIG. 8), the fifth sealing surface 85 and the sixth sealing surface 86 form a third seal 93. In the preferred embodiment, third seal 93 isolates the interior of the canopy (shown in FIGS. 10–14) from ambient atmospheric conditions. Third seal 93 can be formed by any of the same materials described above with respect to the first seal, or any other type of seal known in the art.

Port door 110 is removed from the sealing position with respect to port plate 108 by operation of arm 104, which pivots as shown by arrow 105. Port door 110 can be held in a sealing position with respect to port plate 108 by arm 104, a mechanical latch, linkage arm 152 (shown in FIGS. 10–14) or any other means known in the art.

Port door 110 has a seventh sealing surface 87. Box door 64 has an eighth sealing surface 88. When box door 62 is moved into a sealing position with respect to port door 110 (as in FIG. 8), the seventh sealing surface 87 and the eighth sealing surface 88 form a fourth seal 94. The doors can be held in a sealing position with respect to each other by a mechanical latch, a vacuum created in region 112, a form fit or any other suitable means known in the art. In the preferred embodiment, the fourth seal isolates region 112 between port door 110 and box door 62 so that particles which may have been on the external door surfaces are trapped (sandwiched) between the doors. Fourth seal 94 can be formed by any of the same materials described above with respect to the first seal, or any other type of seal known in the art including a close proximity seal.

Figure 9:
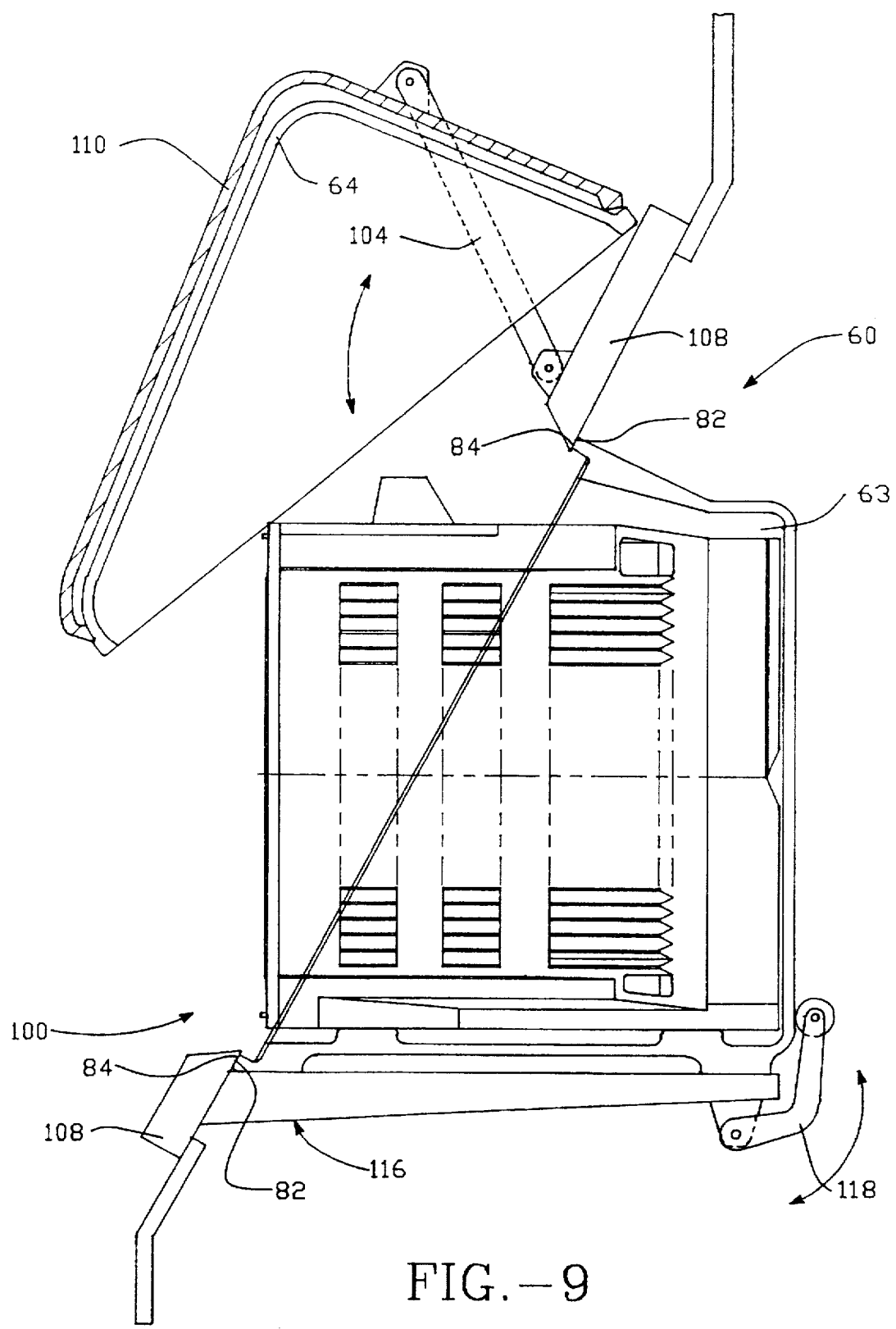
FIG. 9 shows a container engaging a port where the box door and the port door are removed.

FIG. 9 shows container 60 engaging port 100, where box door 64 is in a sealing position with respect to port door 110, and arm 104 has lifted box door 64 and port door 110 to an open position. Box 62, without the box door 64, could have a hexahedron shape. When arm 104 lifts port door 110 and box door 64, cassette 70 can be removed from box 62. Second seal 82 provides for a mini-environment 120 isolated from ambient atmospheric conditions. Therefore, in the preferred embodiment, the wafers continuously remain in a sealed environment.

In FIGS. 2 and 4, cassette 72 shown is a vertical cassette, which stacks wafers vertically, one on top of another (each wafer lies in a horizontal plane). It is also possible to use a horizontal cassette. Horizontal cassettes have two orientations. First, horizontal cassettes can be loaded in the container such that the wafers are stacked vertically, one on top of another, each wafer lying in a horizontal plane. When the cassette is unloaded, it is rotated so that the wafers are stacked horizontally, each wafer lying in a vertical plane. A horizontal cassette could also be designed such that the wafers are stacked horizontally while the cassette is in or out of the container. The wafers are removed from a horizontal cassette vertically in the direction of arrow 153 in FIG. 11. The difference between horizontal and vertical cassette will be more apparent after the discussions with respect to FIGS. 10–14. Additionally, one cassette could be used both in the horizontal mode and vertical mode.

Figure 10:
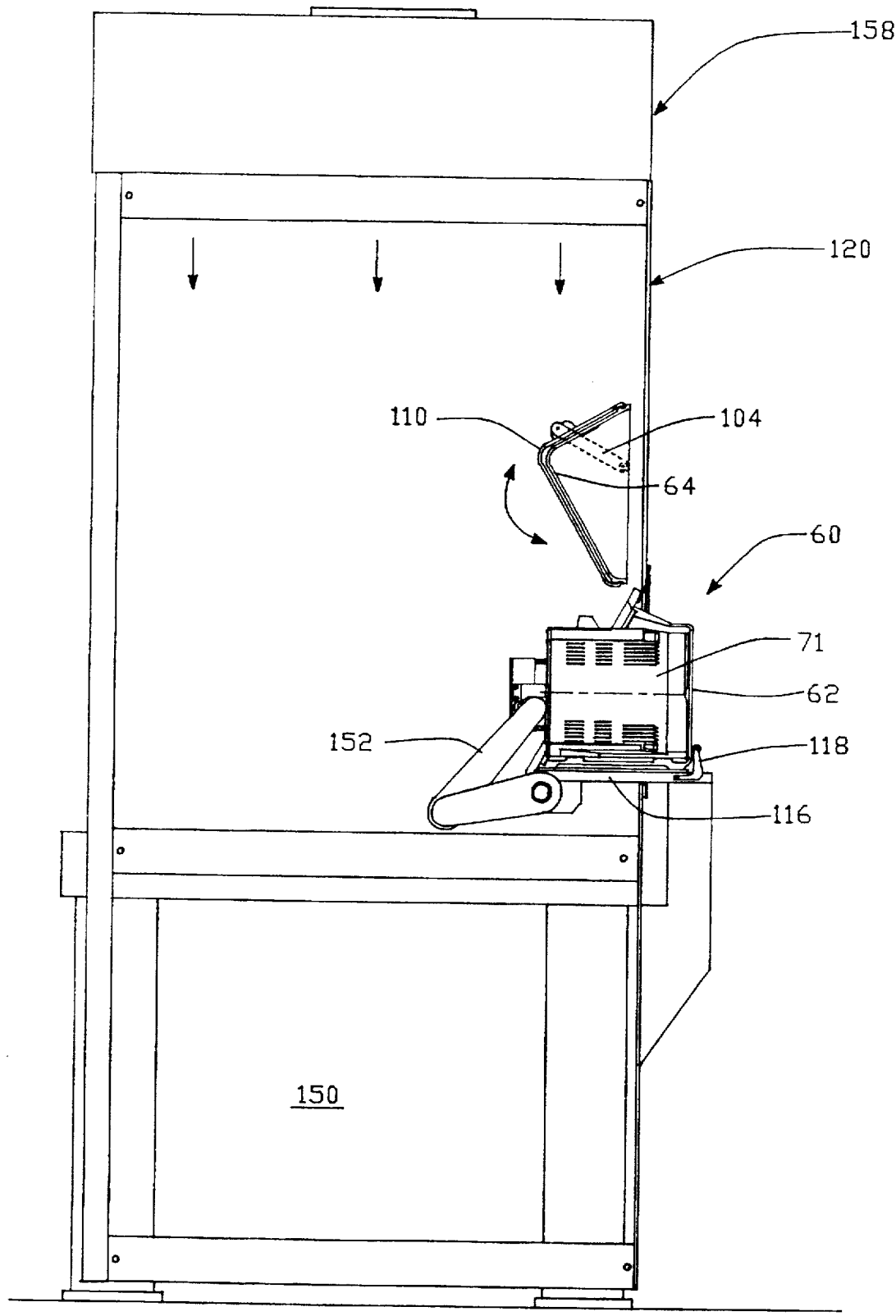
FIG. 10 is a side view of a processing station having a canopy with a port receiving a container with a horizontal cassette.

FIG. 10 shows a container 60 engaging port 100 of a process tool 150. Box 62 is resting on platform 116, held in place by retaining lock 118. Port 100 contains a linkage arm 152 that grabs horizontal cassette 71 and removes the cassette from container 60. FIG. 10 shows horizontal cassette 71 in the load position. Process tool 150 also contains a clean air source 158 for injecting gases into mini-environment 120. Linkage arm 152 removes horizontal cassette 71 from box 62.

Figure 11:
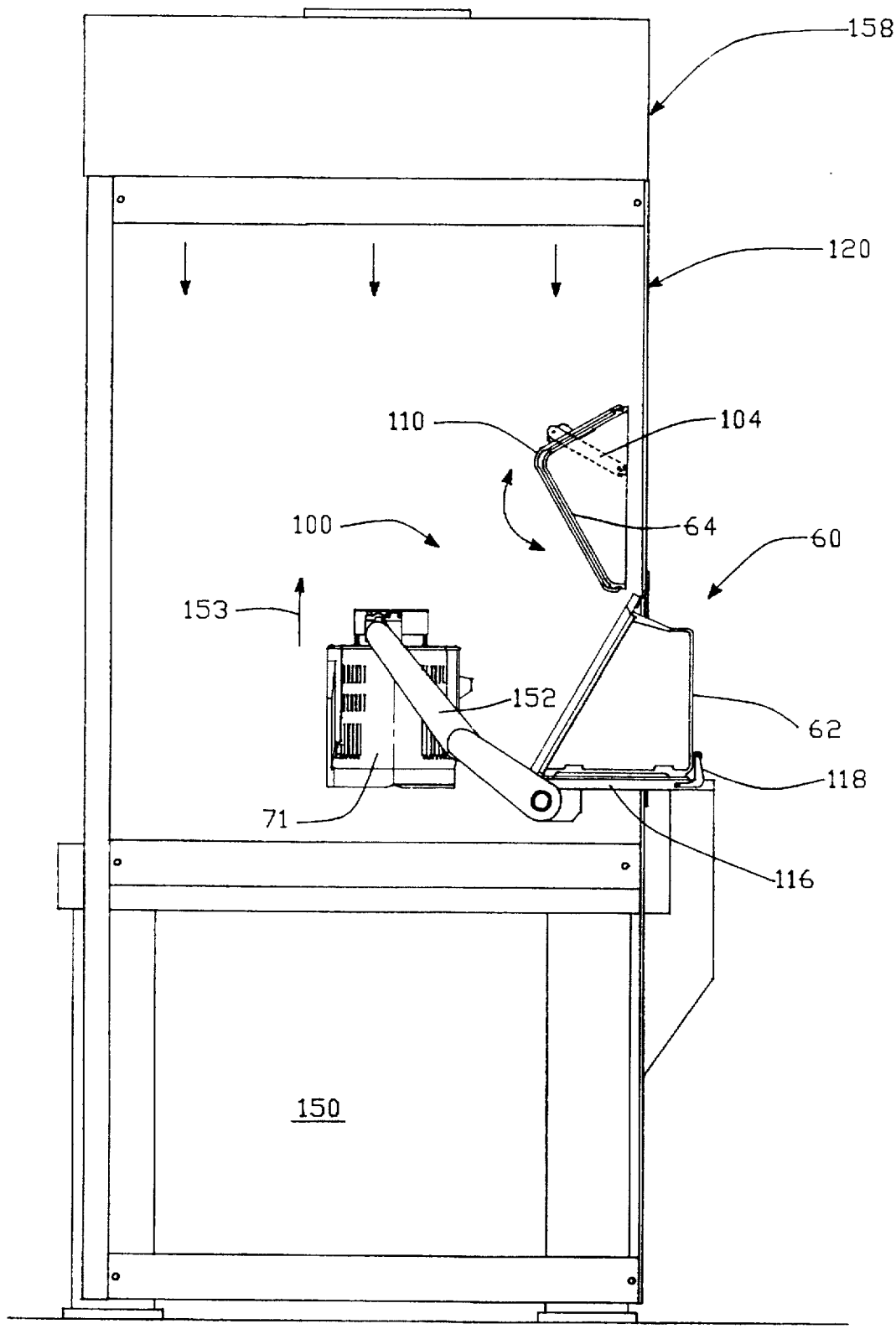
FIG. 11 is the processing station and container of FIG. 10 with the cassette in the unloaded position.

FIG. 11 shows horizontal cassette 71 in the unload position. When horizontal cassette 71 is removed from box 62, it is rotated such that the wafers can be removed vertically in the direction of arrow 153.

Figure 12:
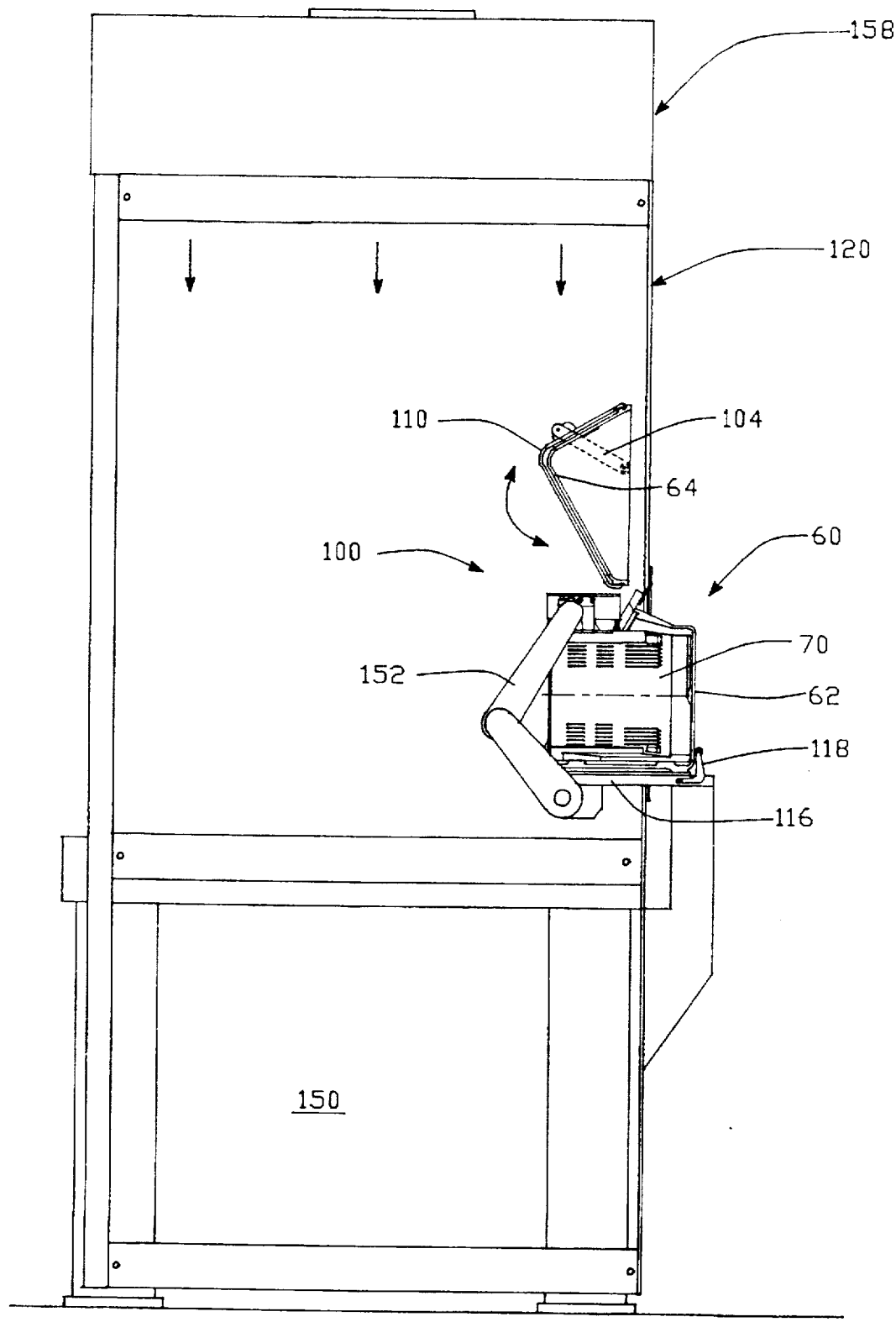
FIG. 12 is a side view of a processing station having a canopy with a port receiving a container with a vertical cassette.
Figure 13:
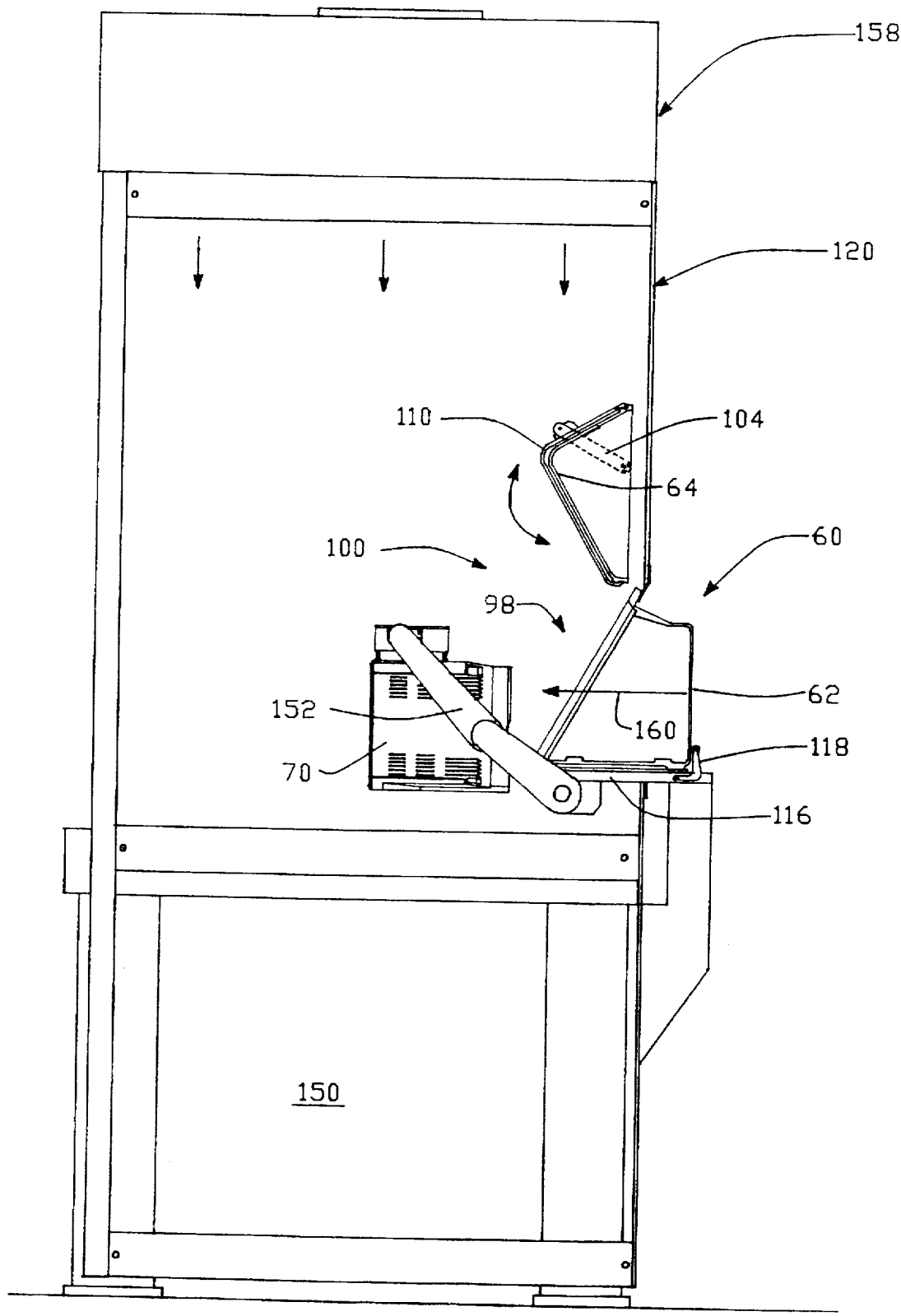
FIG. 13 depicts the processing station and container of FIG. 12 showing the cassette in an unloaded position.

FIGS. 12 and 13 show process tool 150, port 100 and container 60 with a vertical cassette 70. Arm 152 grabs cassette 70 in order to remove cassette 70 from container 60, as shown in FIG. 13. Arrow 160 shows the direction of movement of cassette 70.

Figure 14:
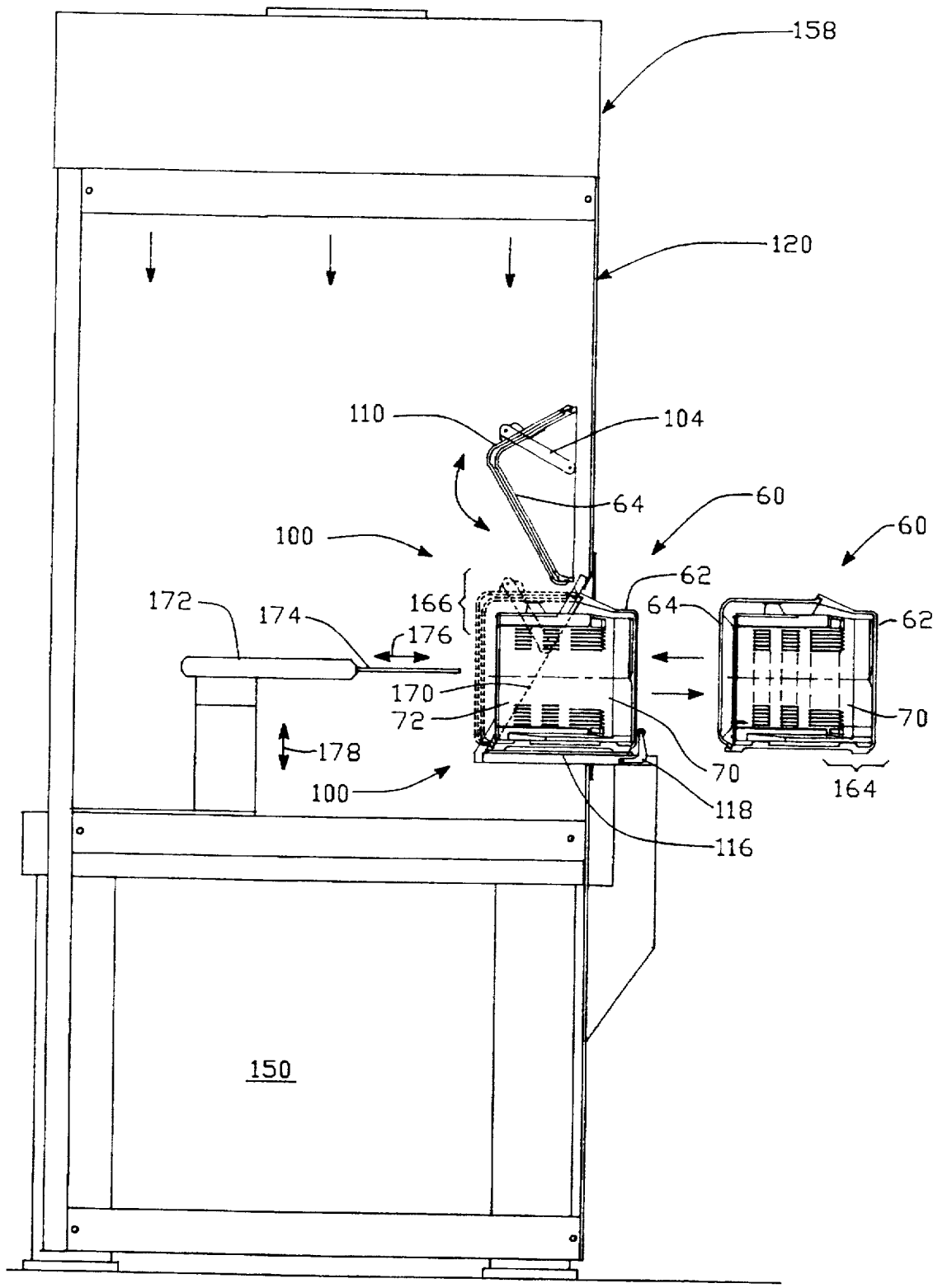
FIG. 14 is a side view of a processing station having a canopy and port receiving a container, showing how a wafer can be removed from the container without removing the cassette.

FIG. 14 shows a process tool 150 with port 100 and a container 60, showing the direct extraction and replacement of wafers 72 without removal of cassette 70. The drawing shows how container 60 can be moved into and out of a sealing position with respect to port 100. In position 164, container 60 is not in a sealing position with respect to port 100. In position 166, container 60 is in a sealing position with respect to port 100. When container 60 is in a sealing position with respect to port 100, door 64 is in a sealing position with respect to door 110 and can be lifted by arm 104. Dotted lines 68 show where the door would be when it is closed. Dotted line 170 shows the port plane. The port plane intersects a plane formed by the bottom surface of box 62 at an angle less than 90° and greater than 0°.

When the container is moved into the sealing position 166 and doors 64 and 110 are lifted, wafer extractor 172 extracts a wafer 72 from cassette 70. Cassette 70 has an open end so that wafers can be inserted and removed. Wafer extractor 172 has a hand 174 that moves in and out of extractor 172 in the direction of bidirectional arrow 176. When hand 174 moves toward cassette 70, hand 174 can grab a wafer 72 and then move in the direction away from cassette 70. Wafer extractor 172 also moves in a vertical direction shown by arrow 178. Furthermore, the wafer extractor can rotate. This embodiment allows the wafers to be removed without removing cassette 70.

FIGS. 10–14 show how the horizontal loading and unloading allow the container to engage a port on a semiconductor manufacturing apparatus at a height considerably lower than the top of the semiconductor manufacturing apparatus. This allows operators to insert the container at eye level or lower. Inserting the container at eye level or lower allows for more accurate alignment, less damage to the wafers, and less physical stress on the operators.

Figure 15:
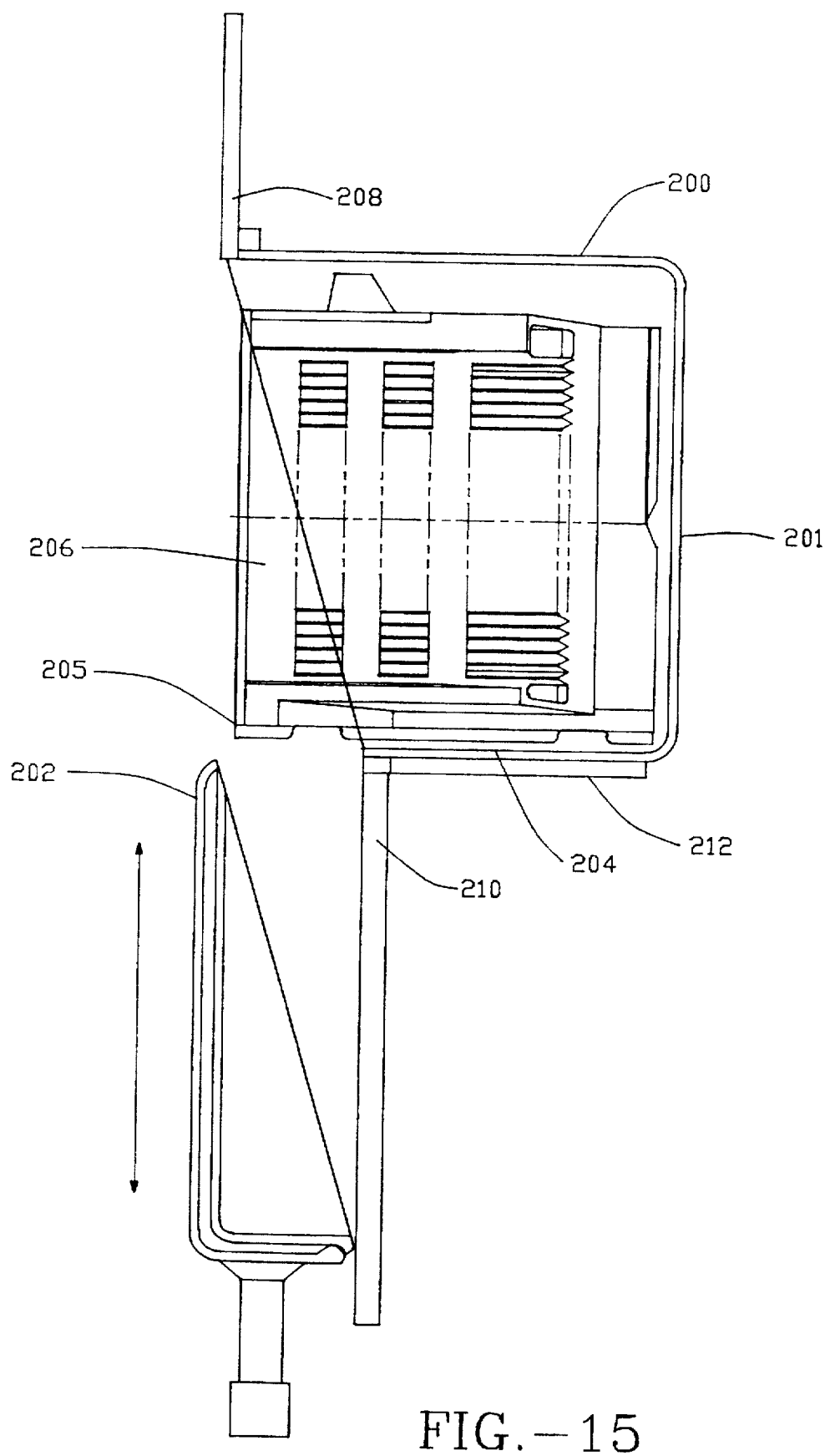
FIG. 15 shows an alternative container engaging a port.

FIG. 15 shows an alternative container 200 which includes a box 201 and box door 202. Container 200 differs from the other embodiments disclosed because the box door is designed to open by dropping down instead of lifting up. That is, the direction of the bias formed by the seal between the box 201 and box door 202 is from the top left hand corner toward the bottom right hand corner whereas the other embodiments disclose a seal forming a bias in the direction from the bottom left hand corner towards the top right hand corner. Regardless of the direction of the bias, all of the embodiments disclosed, including the embodiment in FIG. 15, have a bias angle less than ninety degrees and greater than 0 degrees.

FIG. 15 shows box 201 mated with a port which includes port plates 208 and 210 and platform 212. Once box 201 is mated to the port, box door 202 can be removed. The angular orientation of the seal between box 201 and box door 202 causes part of the bottom surface 204 to be included with the box door 202. Thus, when box door 202 is removed, corner 205 of cassette 206 protrudes out from box 201. Thus, cassette 206 can be removed by grabbing the bottom corner of the cassette, which can be more advantageous than grabbing the top corner of the cassette because the mechanics for grabbing the cassette can then be located below the cassette which, as discussed below, reduces contamination.

Because of the angular orientation of the seal between box 201 and box door 202, box door 202 can be removed using vertical motion without any horizontal movement, horizontal movement without any vertical movement or a combination of horizontal and vertical movement. Because the box door can be removed without horizontal movement, the port area can be made much smaller. Further, because the box door can be removed by lowering box door 202, the mechanics used to lower the box door can be located below the port. This reduces contamination because air flow in a work station is generally from the top of the work station to the bottom. This air flow, in addition to gravity, causes most contaminants to flow towards the bottom of the work station. If the hardware for removing the box door 202 is below the port, then any contaminants generated by this hardware will not pass through the port area. Furthermore, locating the hardware for grabbing the cassette and lowering the door below the port makes it easier to position a wafer sensing device to sense whether wafers are present and accurately positioned in the cassette.

The foregoing description of a preferred embodiment of the invention has been presented for the purposes of illustration and description. It is not intended to be exhaustive or to limit the invention to the precise form disclosed, and obviously, many modifications and variations are possible in light of the above teaching. The particular embodiments were chosen and described in order to best explain the principles of the invention and its practical application to thereby enable others skilled in the art to design other embodiments with various modifications as are suited for their particular purpose as contemplated. It is intended that the scope of the invention be defined by the claims appended hereto.

What is claimed is:

1. A transportable container for storing an article and for use with semiconductor processing equipment having a port, comprising:

a box, said box includes a bottom surface generally defining a first plane, an opening, a first mating surface surrounding said opening and a second mating surface surrounding said first mating surface, said first mating surface generally lying in a second plane such that said first plane intersects said second plane at an angle greater than zero degrees and less than ninety degrees, said second mating surface adapted to mate with the port of the processing equipment; and a box door including a third mating surface adapted to mate with said first mating surface when said box door is in a closed position with respect to said box, said second mating surface is positioned such that said box door can be removed from said closed position and the article can be removed from said box when said second mating surface is mated with the port of the processing equipment.

2. A container according to claim 1, wherein said container further includes a latch for holding said box door in said closed position with respect to said box.

3. A container according claim 2, wherein said latch is a mechanical latch.

4. A container according to claim 2, wherein said latch is a vacuum deflatable seal.

5. A container according to claim 1, wherein said box door is transparent.

6. A container according to claim 1, wherein said box includes a conductive shell.

7. A container according to claim 1, wherein:

said opening is big enough to allow a cassette housing semiconductor wafers to pass through said opening; and said container being of a size to house said cassette when said box door is in said closed position with respect to said box.

8. A container according to claim 1, further including a cassette for holding the article in a position where the article can be removed from the container without removing the cassette.

9. A container according to claim 1, wherein said box door can be removed using vertical motion without any horizontal motion.

10. A sealable, transportable container for storing an article and for use in conjunction with semiconductor processing equipment having a port, the port having a port sealing surface, the container comprising:

a box, said box includes an opening, an interior region for storing the article, a bottom surface, a first sealing surface surrounding said opening and a second sealing surface surrounding said first sealing surface, said second sealing surface adapted to form a port seal with the port sealing surface when said box is moved to a sealing position with respect to the port, said bottom surface generally defining a bottom plane, said opening generally defining an opening plane, said opening plane intersecting said bottom plane at an angle greater than zero degrees and less than ninety degrees;

a box door including a third sealing surface, said third sealing surface and said first sealing surface forming a container seal isolating said interior region from ambient atmospheric conditions when said box door is moved to a sealing position with respect to said box, said second sealing surface is positioned such that said box door can be removed from said sealing position with respect to said box and the article can be removed from said box when said box is in said sealing position with respect to the port; and a latch capable of retaining said box door in the sealing position.

11. A container according to claim 10, wherein said box door is transparent.

12. A container according to claim 10, further including:

a cassette for holding the article so that the article can be removed from said interior region without removing said cassette from said interior region.

13. The container of claim 12, further including a cassette retainer for preventing said cassette from moving when said box door is in a sealing position.

14. A sealable, transportable container for storing an article and for use in conjunction with semiconductor processing equipment having a port, the port having a port sealing surface, the container comprising:

a base, said base including an opening, an interior region for storing the article, a bottom surface, a first sealing surface surrounding said opening and a second sealing surface surrounding said first sealing surface, said second sealing surface adapted to form a port seal with the port sealing surface when said base is moved to a sealing position with respect to the port;

a door including a peripheral edge, said peripheral edge having a third sealing surface, said third sealing surface and said first sealing surface form a container seal when said door is in a sealing position with respect to said base, said container seal generally lying in a first plane forming a bias on a profile of the container said second sealing surface is positioned such that said door can be removed from said sealing position with respect to said base and the article can be removed from said base while said second mating surface forms said port seal with the port sealing surface; and a latch capable of retaining said door in said sealing position.

15. A container according to claim 14, wherein said door is transparent.

16. A container according to claim 14, further including:

a cassette for holding the article so that the article can be removed from the interior region without removing the cassette from the interior region.

17. The container of claim 14, further including a cassette retainer for preventing said cassette from moving when said door is in a sealing position.

18. A SMIF system for maintaining the cleanliness of an article, comprising:

a box including an opening, an interior region for storing the article, a bottom surface, a first sealing surface surrounding said opening and a second sealing surface surrounding said first sealing surface, said bottom surface generally defining a bottom plane, said opening generally defining an opening plane, said opening plane intersecting said bottom plane at an angle greater than zero degrees and less than ninety degrees;

a box door including a peripheral edge, said peripheral edge having a third sealing surface, said third sealing surface and said first sealing surface forming a first seal isolating said interior region from ambient atmospheric conditions when said box door is moved to a sealing position with respect to said box, said box door further having a fourth sealing surface;

a latch for retaining said box door in said sealing position;

a port plate for receiving said box, said port plate including a fifth sealing surface and a sixth sealing surface, said fifth sealing surface and said second sealing surface forming a second seal when said box is moved to a sealing position with respect to said port plate, and a port door including a seventh sealing surface and an eighth sealing surface, the seventh sealing surface and the sixth sealing surface forming a third seal maintaining a clean environment within a port when said port door is moved to a sealing position with respect to said port plate, said fourth sealing surface and the eighth sealing surface forming a fourth seal when said box door is moved to a sealing position with respect to said port door.

19. A system according to claim 18, further including a retaining lock for retaining said box in the sealing position with respect to said port plate.

20. A system according to claim 18, further comprising an arm for lifting said port door away from the sealing position with respect to said port plate.

21. A system according to claim 18, further comprising a cassette for holding the article so that the article can be removed from said interior region without removing said cassette from said interior region.

22. A system according to claim 21, further comprising an extractor for extracting the article from said cassette when the cassette is in said box.

23. A system according to claim 18, further including:

a port support shelf for supporting said box when said box is moved to a sealing position with respect to said port plate.

24. A system for maintaining the cleanliness of an article, comprising:

a box including an opening, an interior region for storing the article, a bottom surface, a first docking surface surrounding said opening and a second docking surface surrounding said first docking surface, said bottom surface generally defining a bottom plane, at least a portion of said first docking surface defining an opening plane, said opening plane intersecting said bottom plane at an angle greater than zero degrees and less than ninety degrees;

a box door including a peripheral edge, said peripheral edge having a third docking surface, said third docking surface and said first docking surface meeting when said box door is moved to a closed position with respect to said box, said box door further having a fourth docking surface;

a port plate for receiving said box, said port plate including a fifth docking surface and a sixth docking surface, said fifth docking surface and said second docking surface meeting when said box is moved to a docking position with respect to said port plate, and a port door including a seventh docking surface and an eighth docking surface, said seventh docking surface and said sixth docking surface meeting port door is moved to a closed position with respect to said port plate, said fourth docking surface and the eight docking surface meeting when said box door is moved to a contact position with respect to said port door.

25. A system for maintaining the cleanliness of articles according to claim 24, wherein:

said box door can be removed from said closed position with respect to said box by lowering said box door.

26. A system for maintaining the cleanliness of articles according to claim 24, wherein:

said box door can be removed from said closed position with respect to said box using vertical motion without any horizontal movement.

27. A system for maintaining the cleanliness of articles according to claim 24, wherein:

said box door can be removed from said closed position with respect to said box using a combination of horizontal and vertical movement.

28. A transportable container for storing an article and for use in conjunction with semiconductor processing equipment having a port, said port having a port sealing surface, the container comprising:

a box, said box including an opening, an interior region for storing said article, a bottom surface for supporting said article, a first docking surface surrounding said opening and a second docking surface surrounding said first docking surface, said bottom surface generally defining a bottom plane, at least a portion of said opening defining an opening plane, said opening plane intersecting said bottom plane at an angle greater than zero degrees and less than ninety degrees, said second docking surface generally lying in a second docking surface plane such that said second docking surface plane intersects said bottom plane at an angle greater than zero degrees; and a box door including a peripheral edge, said peripheral edge having a third docking surface, said third docking surface and said first docking surface meeting when said box door is moved to a closed position with respect to said box.

29. A container according to claim 28, further including a latch for retaining said box door in said sealing position.

30. A transportable container according to claim 28, wherein:

said box door can be removed from said closed position with respect to said box by lowering said box door.

31. A transportable container according to claim 28, wherein:

said box door can be removed from said closed position with respect to said box using vertical motion without any horizontal movement.

32. A transportable container according to claim 28, wherein:

said box door can be removed from said closed position with respect to said box using a combination of horizontal and vertical movement.

33. A transportable container according to claim 28, wherein:

at least a portion of said opening plane forms a bias along a profile of said container from a top left portion of said profile of said container to a bottom right portion of said profile of said container.

34. A container according to claim 28, wherein said second docking surface plane does not intersect said opening plane within boundaries of said box.

35. A transportable container for storing an article and for use with semiconductor processing equipment having a port, comprising:

a box, said box includes a bottom surface generally defining a first plane, an opening, a first mating surface surrounding said opening and a second mating surface surrounding said first mating surface, said first mating surface generally lying in a second plane such that said first plane intersects said second plane at an angle greater than zero degrees and less than ninety degrees, said second mating surface adapted to mate with the port of the processing equipment, and said second mating surface generally lying in a third plane such that said first plane intersects said third plane at an angle greater than zero degrees; and a box door including a third mating surface adapted to mate with said first mating surface when said box door is in a closed position with respect to said box.

36. A container according to claim 35, wherein said third plane does not intersect said second plane within boundaries of said box.

* * * * *

UNITED STATES PATENT AND TRADEMARK OFFICE
CERTIFICATE OF CORRECTION

PATENT NO. : 5,895,191
DATED : April 20, 1999
INVENTOR(S) : Anthony C. Bonora, William J. Fosnight It is certified that error appears in the above-identified patent and that said Letters Patent is hereby corrected as shown below:

Column 11, line 63, after "meeting" and before "port" please insert --forming a third seal maintaining a clean environment within the port when said--.

Signed and Sealed this

Sixteenth Day of May, 2000

Q. TODD DICKINSON

Attest:

Attesting Officer

Director of Patents and Trademarks